United States Patent [19]

Hashimoto

[11] Patent Number: 4,985,758

[45] Date of Patent: Jan. 15, 1991

[54] SIGNAL PROCESSING SYSTEM HAVING SELECTED OUTPUT FROM PLURAL READOUT DEVICES

[75] Inventor: Seiji Hashimoto, Yokohama, Japan

[73] Assignee: Canon Kabushiki Kaisha, Tokyo, Japan

[21] Appl. No.: 522,457

[22] Filed: May 14, 1990

Related U.S. Application Data

[63] Continuation of Ser. No. 557,940, Dec. 5, 1983, abandoned.

[30] Foreign Application Priority Data

Dec. 7, 1982 [JP] Japan .............................. 57-214413
Dec. 10, 1982 [JP] Japan .............................. 57-216388

[51] Int. Cl.[5] ...................... H04N 9/077; H04N 3/15; H04N 5/335
[52] U.S. Cl. ..................................... 358/44; 358/41; 358/213.26; 358/213.28; 358/213.29; 357/24
[58] Field of Search ........................ 358/41, 43, 44, 48, 358/54, 212, 213, 213.11, 213.26, 213.27, 213.28, 213.29, 471, 474, 482, 483, 494

[56] References Cited

U.S. PATENT DOCUMENTS

| | | | |
|---|---|---|---|
| 4,127,877 | 11/1978 | Morishita et al. | 358/213 |
| 4,194,220 | 3/1980 | Frame | 358/221 |
| 4,237,383 | 12/1980 | Kosonocky et al. | 358/213 |
| 4,263,620 | 4/1981 | Félix | 358/213.29 |
| 4,271,429 | 6/1981 | Herbst | 358/54 |
| 4,331,979 | 5/1982 | Bendell | 358/55 |
| 4,438,457 | 3/1984 | Tandon et al. | 358/213 |
| 4,481,522 | 11/1984 | Jastrzebski et al. | 358/44 |
| 4,506,301 | 3/1985 | Kingsley et al. | 358/294 |
| 4,513,313 | 4/1985 | Kinoshita et al. | 358/44 |
| 4,553,159 | 11/1985 | Moraillon | 358/44 |
| 4,751,567 | 6/1988 | Hashimoto | 358/44 |

FOREIGN PATENT DOCUMENTS

| | | | |
|---|---|---|---|
| 3305027 | 9/1983 | Fed. Rep. of Germany | 358/44 |
| 55-147890 | 11/1980 | Japan | 358/43 |
| 56-36272 | 4/1981 | Japan | 358/213.26 |
| 56-116372 | 9/1981 | Japan | 358/213.29 |
| 57-181274 | 11/1982 | Japan | 358/213.26 |

OTHER PUBLICATIONS

Li, Kam, "High Density Charge Coupled Device for Linear Image Sensor", *Xerox Disclosure Journal*, vol. 2, No. 5, Sep./Oct., 1977, pp. 83–84.

Japanese Broadcasting Corporation (NMK), *Video Camera and Its Usage*, Mar. 1981, pp. 134–138, with partial English translation.

*Primary Examiner*—James J. Groody
*Assistant Examiner*—Mark R. Powell
*Attorney, Agent, or Firm*—Fitzpatrick, Cella, Harper & Scinto

[57] ABSTRACT

A signal processing system has an image pickup device and a plurality of different color filters which generate a plurality of color signals. A memory stores the color signals, and a plurality of readout devices divides the signals from the memory into the plurality of color signals. A switching device sequentially supplies the color signals to a common output terminal. The switching device is formed on one chip, together with the memory and the plurality of readout devices. Control circuitry controls the switching device to output a dot-sequential signal. A processor processes the dot-sequential signal into a luminance signal.

56 Claims, 12 Drawing Sheets

SIGNAL PROCESSING SYSTEM HAVING SELECTED OUTPUT FROM PLURAL READOUT DEVICES

This application is a continuation of application Ser. No. 557,940 filed Dec. 5, 1983, now abandoned.

BACKGROUND OF THE INVENTION

1. Field of the Invention

The present invention relates to a solid state signal processing device and a signal processor using the same.

2. Decsription of the Prior Art

Conventionally, an X-Y addressing MOS image sensor, an interline CCD, a frame transfer CCD and the like are known as solid state signal processing elements.

Among these elements, a vertical transfer register and a switching element need not be arranged in the frame transfer CCD, unlike the MOS image sensor and the interline CCD. For this reason, the number of horizontal pels on a TV screen can be increased in the frame transfer CCD.

In general, the frame transfer CCD comprises: an image sensing part for performing photoelectric transducing operations; a memory for temporarily storing charge data from the image sensing part; a horizontal shift register for reading out the stored charge data from the memory in accordance with television synchronization and for transferring the data horizontally; and an output amplifier for converting the readout charge data to a voltage signal. An optical means such as a color separation filter for preparing a color signal is adhered to the CCD image sensing part or is formed on a CCD image sensing chip. In particular, a frame transfer CCD having a stripe color filter on the image sensing part is exemplified, wherein the stripe color filter has R (red), G (green) and B(blue) filter elements.

When the number of horizontal pels is about 580, a horizontal transfer frequency corresponds to 10.7 MHz. When a CCD has the number of horizontal elements described above, a luminance signal is obtained by filtering an output signal of the CCD through a low-pass filter (about 3 MHz). The R-G-B signal having a repeating frequency of 3.58 MHz is supplied to sample/hold circuits to perform color separation.

In this case, color signals require an NTSC bandwidth of 500 KHz. In this case, the sampling frequency is 3.58 MHz, so that the signal bandwidth allows reproduction up to the Nyquist frequency. When an object is non-colored or non-chromatic, the luminance signal is not degraded. However, when an object has a high color saturation, the sampling frequency becomes 3.58 MHz (Nyquist frequency of 1.8 MHz), so that a significant foldover distortion occurs, thereby degrading the image quality. In order to solve this problem, the CCD must be driven in response to a clock of 14 MHz under the condition that the number of horizontal pels is 770. The sampling frequency becomes about 4.77 MHz (Nyquist frequency of 2.4 MHz), so that no problem occurs in the normal receiver. However, when the CCD is driven at the frequency of 14 MHz, a problem occurs in the horizontal register, the output amplifier, a clock IC, the color separation sample/hold circuit, and so on.

In order to separate the CCD output signal by the sample/hold circuit into color R, G and B signals, the signal which is subjected to sampling/holding must have a long and valid signal component to some extent. However, when a drive pulse having a duty ratio of 50% is used, the signal component with respect to the clock pulse of 14 MHz becomes theoretically 35 ns. However, when the rise and fall times of the switching element of the drive circuit are subtracted from the signal duration of 35 ns, the valid signal component has at best a duration of 25 ns. Furthermore, when the leading and trailing edges of the clock are excessively steep, a dark current is increased due to heat in the shift register. The valid signal component then has a shorter valid duration. In addition to these disadvantages, the frequency characteristics of the output amplifier must also be considered.

Variations in electrical characteristics of circuit elements in a clock signal generator, and changes in temperature adversely affect sampling. It is thus very difficult to sample the CCD signal.

Assume a one-phase driven horizontal shift register. A potential well and a barrier are included in each one of a virtual electrode and a clock electrode. When the number of pels is 770,3080 (770 × 4) divided electrodes are required. In order to achieve this on the image sensing part of 3 inch size, since the horizontal width is about 8.8 mm, the minimum electrode width becomes less than 2.8 μm. This cannot be achieved in accordance with current known micropatterning techniques having a 3 μm standard.

In the conventional color separation sample/hold circuit, three sample/hold circuits for separating the CCD output into the color R, G and B signals and another sample/hold circuit for supplying a proper sampled/held signal to these sample/hold circuits are required, resulting in complex construction.

SUMMARY OF THE INVENTION

It is an object of the present invention to provide a solid state signal processing device which eliminates the conventional drawbacks described above.

It is another object of the present invention to provide a solid state signal processing device wherein good reproducibility can be provided even in accordance with known micropatterning techniques, a readout clock can have a low frequency even if the number of elements along the horizontal direction of the image sensing part is increased, and good transfer efficiency can be obtained.

It is still another object of the present invention to provide a new and improved solid state signal processing device which has low power consumption and allows easy subsequent signal processing.

It is still another object of the present invention to provide a signal processor using such a solid state signal processing device, wherein an output having a high duty can be obtained without impairing a high frequency component.

DETAILED DESCRIPTION OF THE PREFERRED EMBODIMENTS

Embodiments of the present invention will be described in detail with reference to the accompanying drawings.

Figure 1:
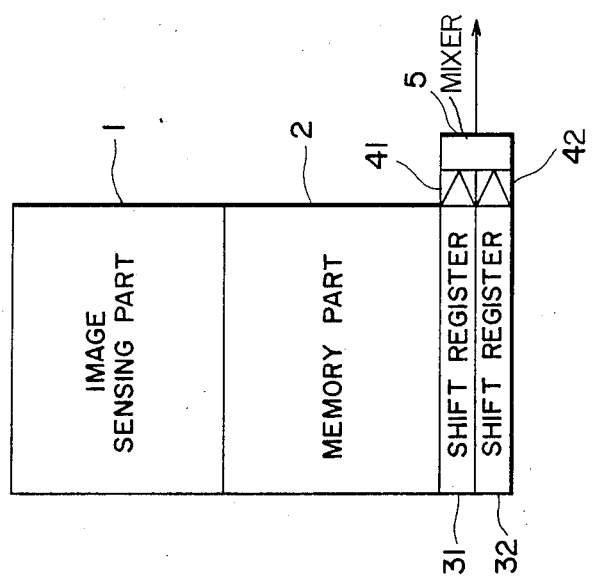
FIG. 1 is a diagram showing a first embodiment of a solid state signal processing device of the present invention.

FIG. 1 shows a first embodiment of a solid state signal processing device of the present invention.

This embodiment is exemplified by the solid state signal processing device as a frame transfer CCD.

An image sensing part 1 comprises a plurality of pels. A memory 2 has a plurality of memory cells. The memory cells temporarily store charge data formed by the image sensing part 1.

In this embodiment, the memory 2 is free from light exposure. However, light may be incident on a memory which then also serves as the image sensing part.

CCD horizontal shift registers 31 and 32 serve to read out charge data from the memory 2. Each shift register stores one-horizontal line charge data and sequentially shifts and generates the readout data.

Output amplifiers 41 and 42 which serve as converters are respectively connected to the output terminals of the shift registers 31 and 32. Each output amplifier converts the charge data (shifted by the corresponding register) to a voltage signal. A mixer 5 serves as a switching means which selectively generates outputs (from the output amplifiers 41 and 42) at given phases. The mixer 5 is formed on a single semiconductor substrate together with the memory 2, the horizontal shift registers 31 and 32, and the output amplifiers 41 and 42.

In this embodiment, two horizontal shift registers are formed. However, three or more horizontal shift registers may be formed on a single chip.

Furthermore, in this embodiment, the number of horizontal cells of each of the shift registers 31 and 32 is smaller than that of the memory 2. More particularly, the number of cells of each of the shift registers 31 and 32 is about half that along the horizontal direction of the memory 2.

Figure 2:
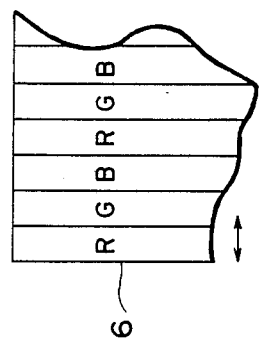
FIG. 2 is a diagram showing part of a color separation filter used in the solid state signal processing device shown in FIG. 1.

FIG. 2 shows a color separation filter arranged in an incident-light optical path toward the image sensing part of the frame transfer CCD shown in FIG. 1.

In this embodiment, a stripe filter is used as the color separation filter 6. The stripe filter has a repeated pattern of R (red), G (green) and B (blue) color transmission filter elements. However, the arrangement of the color separation filter 6 is not limited to the stripe filter, but may be extended to a mosaic filter.

The combination of color components is not limited to the one given in this embodiment. Any other combination of colors can also be utilized.

Figure 3:
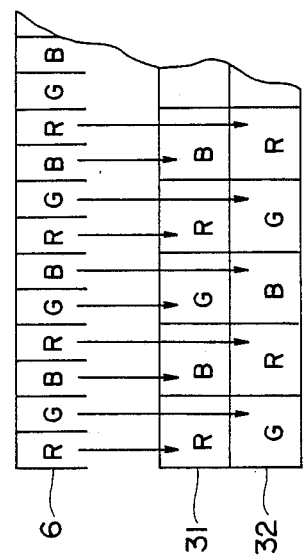
FIG. 3 is a diagram showing a method for dividing and storing horizontal line data from a memory in a register.

The stripes of the filter 6 shown in FIG. 2 respectively correspond to the pels of the image sensing part. FIG. 3 shows a method wherein the charge data components formed by the pels respectively corresponding to the stripes are divided and stored in the registers 31 and 32.

In this embodiment, the charge data components of every other one-horizontal line cell are stored in the register 31, and the remaining charge components are sequentially stored in the register 32.

In this manner, the charge data component of the cells aligned in line in the horizontal direction of the memory 2 are alternately stored in cells of the register 31 or 32. The one-horizontal line data are thus divided and stored in the two registers 31 and 32.

The number of horizontal cells of the registers can be half that of the conventional horizontal cells. Therefore, the frequency of the clock pulse can be halved, thereby greatly improving the transfer efficiency, and easily sampling/holding the output from the individual cell of each register. In this manner, after the one-horizontal line data of the memory is read out and divided into two portions which are respectively stored in the two registers, another one-horizontal line data is stored in the two registers. By repeating the above operation, all data from the memory can be read out in synchronism with the standard television signal.

Since the readout signal from the image sensing device can have a considerably low frequency, the readout signal can be properly sampled. Along with this, the drive clock has a low frequency, thereby decreasing power consumption. Furthermore, the transfer efficiency can be improved, thus obtaining a high S/N ratio.

Figure 4:
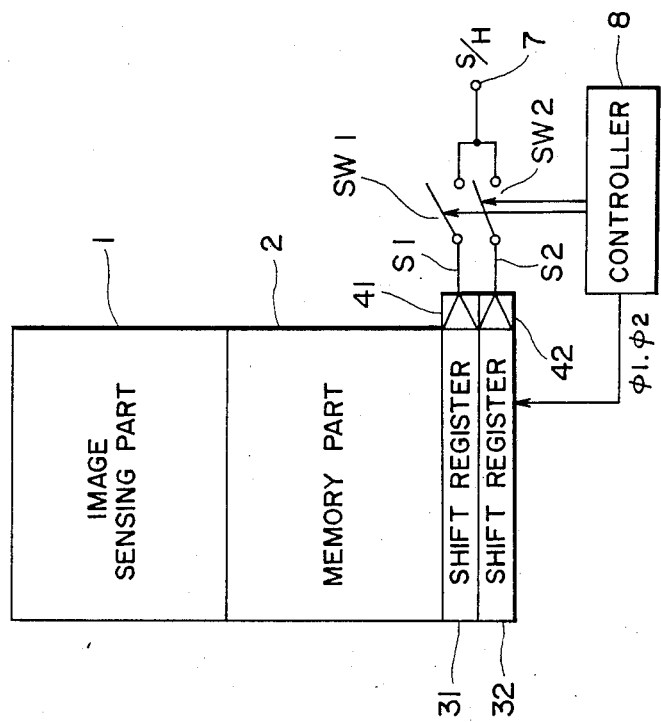
FIG. 4 is a diagram showing a first embodiment of a mixer of the present invention.

FIG. 4 shows a first embodiment of a mixer 5. The mixer 5 comprises switches SW1 and SW2 which are alternately operated so as to respectively supply output from output amplifiers 41 and 42 to a terminal 7 under the control of a controller 8 as a controlling means.

Figure 5:
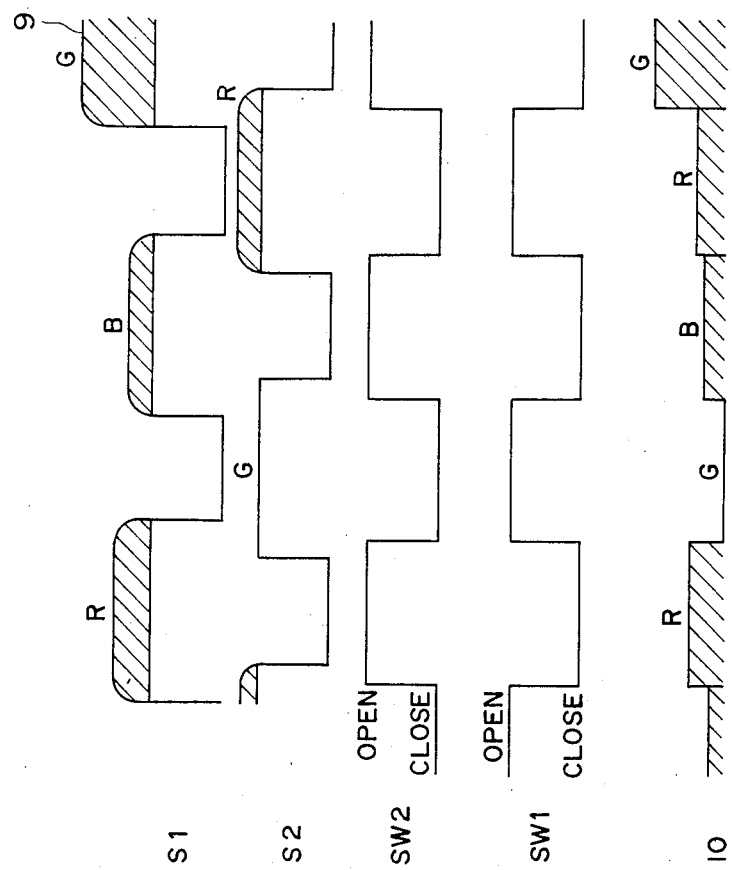
FIG. 5 is a timing chart for explaining a control method used by the controlling means.

FIG. 5 is a timing chart of control pulses generated by the controller 8. The controller 8 generates clock pulses $\phi 1$ and $\phi 2$ which are respectively used to drive the registers 31 and 32.

The clock pulses $\phi 1$ and $\phi 2$ have the sam frequency but an opposite phase (180° apart).

The outputs from the output amplifiers 41 and 42 are respectively given as signals S1 and S2. It should be noted that hatched portions 9 respectively indicate corresponding signal components. The switch SW1 is closed to periodically supply the signal component of the signal S1 with a duty ratio of 50% to the terminal 7.

The ON duration of the switch SW1 is set to be shorter than a duty of the signal superposed with the signal component of the signal S1.

The periodic ON/OFF timing of the switch SW2 is 180° shifted from that of the switch SW1. The duty ratio of the ON duration of each switch SW1 or SW2 may be less than 50%.

With this arrangement, a dot-sequential signal (indicated by reference numeral 10) having a duty ratio of 100% is obtained.

During the operation for reading out data from the memory, the data is divided and stored in a plurality of registers so as to halve the readout frequency. Before the outputs from the registers are used in practice, the phases of the output are shifted and mixed to obtain a desired carrier frequency.

In the conventional system wherein only one horizontal register is used to read out the data from the memory, the duty of the dot-sequential signal component can be limited in accordance with the transfer pulse duty. However, according to the present invention, the mixed dot-sequential signal component can have a duty ratio of 100%. The frequency characteristics of the following sample/hold stage can be changed in accordance with a proper change in duty ratio.

According to this embodiment, when the horizontal transfer clock frequency of each register and the ON/OFF timing of each switch SW1 or SW2 are properly selected, a dot-sequential signal having a desired frequency can be obtained. As described above, the duty ratio of the dot-sequential signal can be increased, so that stable sampling can be performed in the subsequent sample/hold stage. Furthermore, only one signal processing system is required, so that the following various signal processing circuits can be arranged in accordance with a signal system. The outputs are synthesized by the switching output section, so that a plurality of CCD registers need not be coupled, thereby improving the CCD transfer efficiency and a drive speed, unlike the system wherein the CCD register outputs are synthesized by a CCD arrangement.

Furthermore, in this embodiment, the switch output section is formed on a single chip, thereby preventing leakage of noise and assuring stable operation.

Figure 6:
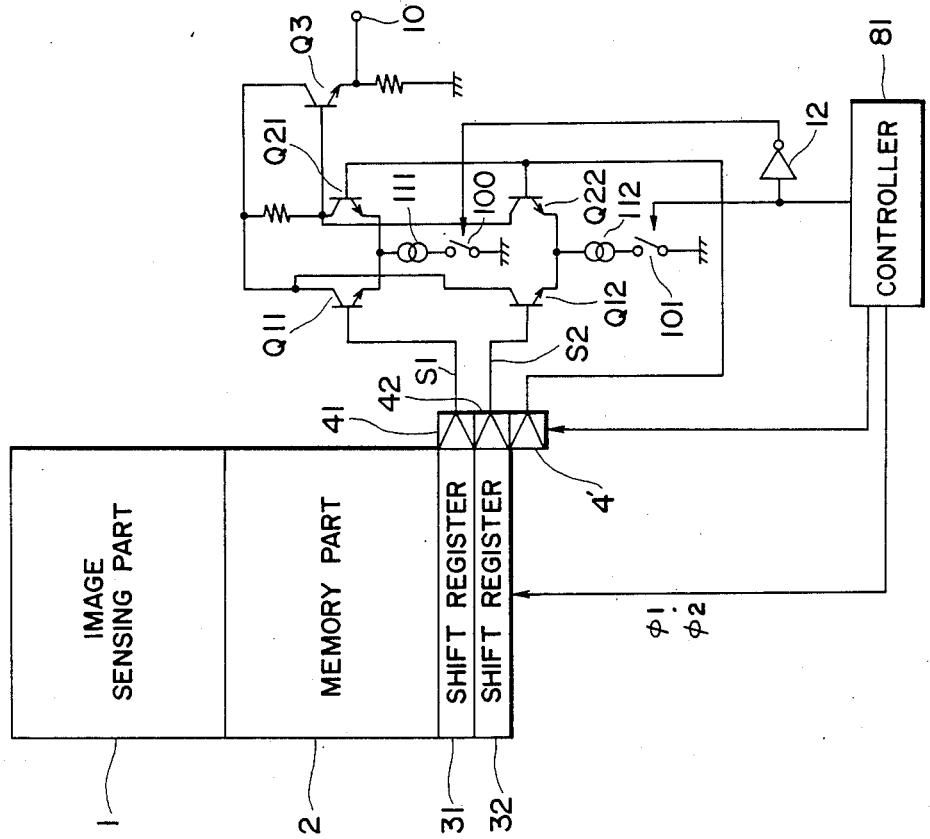
FIG. 6 is a diagram showing a second embodiment of a mixer of the present invention.

FIG. 6 shows a second embodiment of a mixer, wherein outputs from a plurality of registers are mixed in a noise reduction circuit so as to reduce amplification noise of output amplifiers 41 and 42 of the horizontal shift registers.

In this embodiment, first and second differential amplifiers serving as arithmetical operation means for noise reduction are arranged to receive register outputs S1 and S2, respectively. The reference voltages of the differential amplifiers are commonly supplied from a dummy amplifier 4'.

The dummy amplifier 4' has substantially the same electrical characteristics as the output amplifiers 41 and 42 and is formed on the same semiconductor substrate. The same amplification noise as in the output amplifiers 41 and 42 is derived from the dummy amplifier 4'. The same clock pulses as supplied to the output amplifiers 41 and 42 are supplied to the dummy amplifier 4'. Transistors Q11 and Q21 constitute a first differential amplifier, and transistors Q12 and Q22 constitute a second differential amplifier. Output from the first and second differential amplifier are supplied to a common buffer power transister Q3.

Reference numerals 111 and 112 denote constant current sources, respectively. Switches 100 and 101 are controlled by a controller 81 such that the ON/OFF operation of the switches 100 and 101 is performed in an inverted manner.

The controller 81 controls the horizontal transfer operation of the horizontal shift registers 31 and 32.

The outputs from the first and second differential amplifiers alternately appear at a terminal 10.

Furthermore, by alternately obtaining an output difference between the outputs from the dummy amplifier 4' and the output amplifiers 41 and 42, a noise free signal appears at the terminal 10.

The ON/OFF timing of the switches 100 and 101 is the same as that of the first embodiment in FIG. 5.

The reference voltage of the differential amplifiers need not be the output generated from the dummy amplifier 4'. An analog ground potential may be used as the reference voltage of the differential amplifiers. Since clock noise is mixed in at the ground terminal of the semiconductor substrate which has the registers 31 and 32 thereon, another ground terminal (analog ground) is formed on another portion of the substrate, thereby obtaining the reference voltage.

With the arrangement described above, the DC component of the signal can be obtained without generating the DC component by capacitive coupling of the outputs of the registers. Therefore, the dynamic range of the output signal generated from each register can be sufficiently widened, and the output amplification noise of the register can be reduced.

The single arrangement is used to perform both noise reduction and register output mixing, so that the overall circuit arrangement can be simplified. Therefore, the noise reduction circuit and mixer can be easily formed on a single IC chip.

Figure 7:
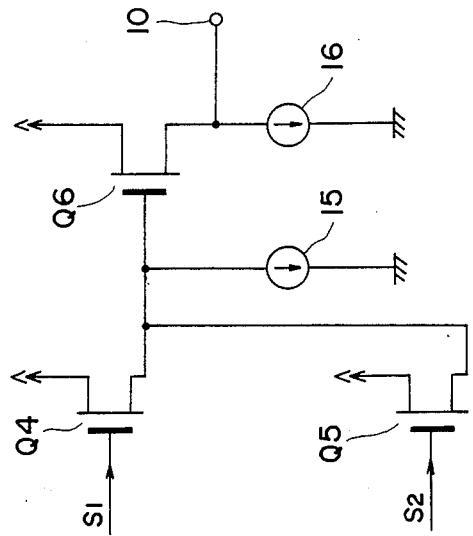
FIG. 7 is a circuit diagram showing a third embodiment of a mixer of the present invention.

FIG. 7 shows a third embodiment of a mixer wherein switching operation of the outputs from a plurality of registers is performed in accordance with the output signal level of each register instead of an external signal.

Referring to FIG. 7, reference symbols Q4 to Q6 denote transistors, respectively. Reference numerals 15 and 16 denote constant current sources, respectively. The transistors Q4 and Q5 constitute a maximum value circuit. One of signals S1 and S2 which has a higher level is supplied to the gate of the transistor Q6 and appears at a terminal 10 through a source follower.

In this case, the registers 31 and 32 perform horizontal transfer respectively in response to the clock signals having the opposing phases, so that each of the levels of the signals S1 and S2 can be inverted in response to a signal having a frequency twice that of the horizontal transfer clock. Therefore, the outputs from the registers are automatically mixed to obtain a dot-sequential signal.

Figure 8:
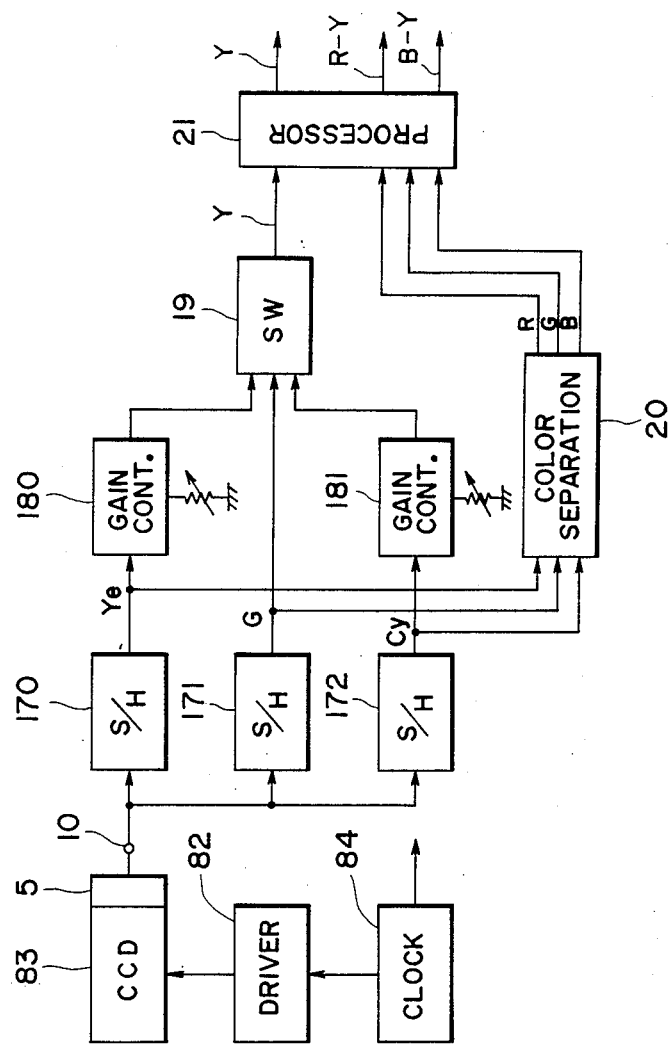
FIGS. 8 and 9 are block diagrams showing first and second embodiments of signal processors adopting the solid state signal processing device of the present invention, respectively.
Figure 9:
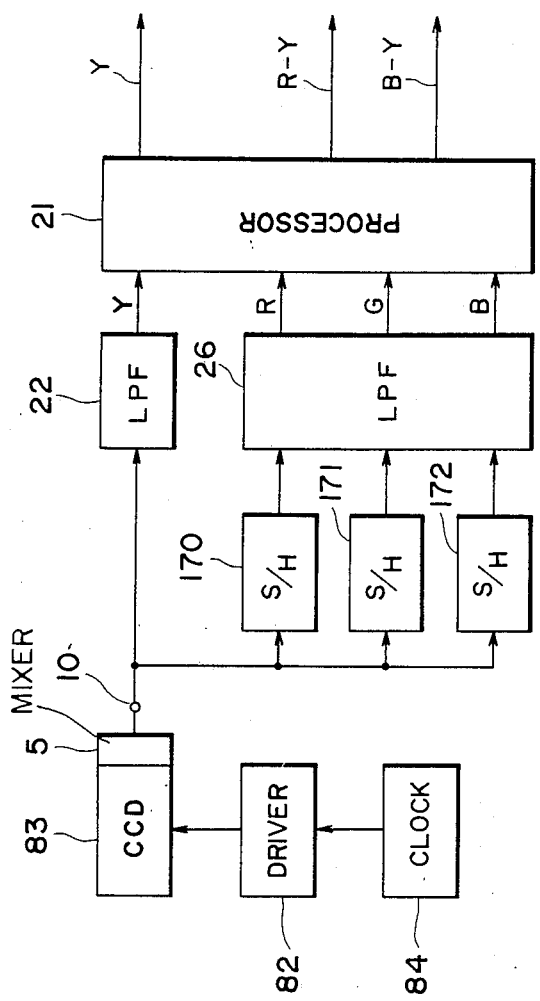

FIGS. 8 and 9 show a first and a second embodiment, respectively, of a signal processor, each using the solid state signal processing device of the present invention.

Referring to FIG. 8, a clock generator 84 serves as a controller. An output from the clock generator 84 is amplified by a driver 82, and an amplified clock signal is supplied to a CCD 83. Outputs from a plurality of horizontal shift registers of the CCD 83 are mixed by a mixer 5, so that a dot-sequential signal can be supplied to sample/hold circuits 170 to 172. In each sample/hold circuit, predetermined color data can be periodically sampled/held and extracted from the dot-sequential color signal at a different given phase.

Assume that a color separation filter comprising Ye (yellow), G (green) and Cy (cyan) components is used in place of the color separation filter shown in FIG. 2. The sample/hold circuits 170 to 172 respectively sample/hold the Ye, G and Cy color signals.

The outputs from the sample/hold circuits 170 and 172 are subjected to level control with respect to the G signal respectively by means of gain control circuits 180 and 181. These color signals are mixed by circuit 19 to produce a dot-sequential luminance (Y) signal.

The outputs from the sample/hold circuits 170 to 172 are subjected to arithmetic operation in a color separator 20, and are converted to R, G and B primary color signals. These signals are supplied to a processor 21 and are subjected to predetermined signal processing, thereby preparing (R-Y) and (B-Y) color difference signals and the luminance (Y) signal.

With this arrangement, sampling/holding in the sample/hold circuits 170 to 172 can be stably performed. The Ye, G and Cy color signals have a gain ratio of 1 : 1 : 1 in the gain control circuits 180 and 181 and are processed to generate a dot-sequential Y signal, thereby reproducing a high-frequency luminance signal.

In the embodiment in FIG. 9, the R-G-B filter shown in FIG. 2 is used. The dot-sequential signal from the mixer 5 is directly filtered through a low-pass filter 22 having a considerably high frequency bandwidth, thereby obtaining the Y signal. Meanwhile, the R, G and B signals are sampled/held in the sample/hold circuits 170 to 172 in accordance with the dot-sequential signal. These color signals are filtered through a low-pass filter 26 and are processed by a processor 21. Therefore, the processor 21 produces the (R-Y) and (B-Y) color difference signals and the luminance (Y) signal.

Figure 10:
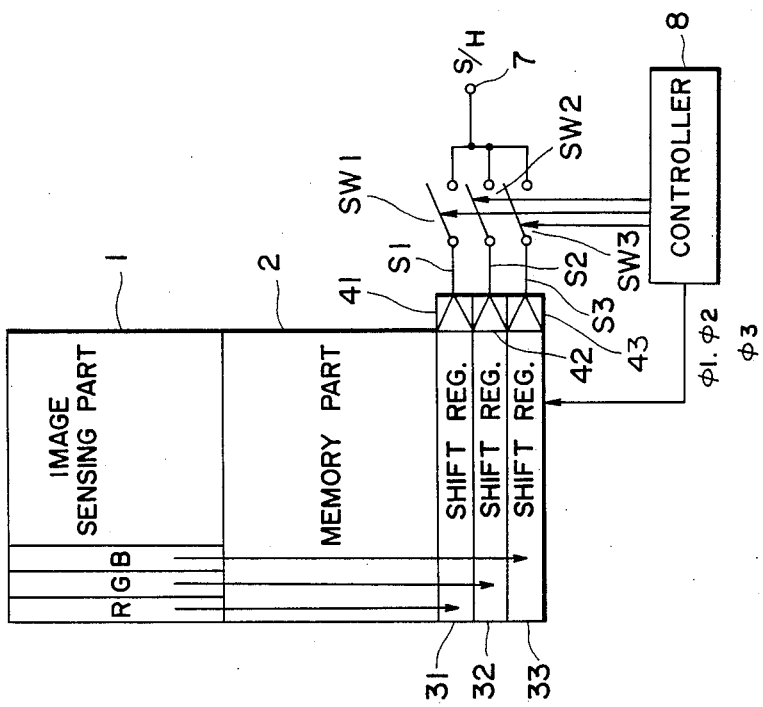
FIG. 10 is a diagram showing a second embodiment of a solid state signal processing device of the present invention.

FIG. 10 shows a second embodiment of a solid signal processing device of the present invention. The same reference numerals used in FIG. 4 denote the same parts in FIG. 10.

A horizontal shift register 33 serves as a readout means. Reference numeral 43 denotes an output amplifier. Reference symbol S3 denotes an output signal line; and SW3, a switch serving as a switching means. The switches SW1, SW2 and SW3 are sequentially subjected to ON/OFF operation. The ON/OFF operation is performed by a controller 8. The filter shown in FIG. 2 is arranged in an image sensing part 1. Horizontal shift registers 31 to 33 are arranged to respectively read out R, G and B color signals. The present invention can thus be applied to a solid state signal processing device having three horizontal shift registers. The present invention can, of course, be applied to a solid state signal processing element having four or more horizontal shift registers.

Figure 11:
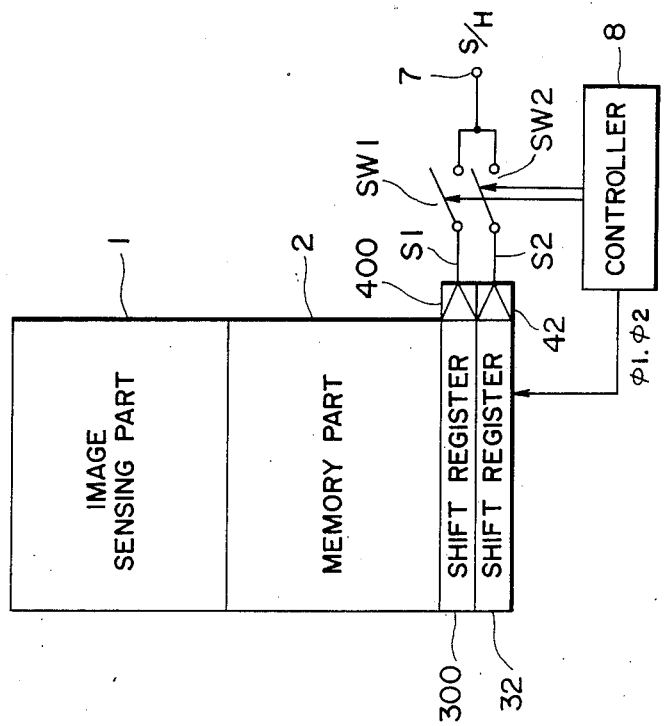
FIG. 11 is a diagram showing a third embodiment of a solid state signal processing device of the present invention.

FIG. 11 shows a third embodiment of a solid state signal processing device of the present invention. The solid state signal processing device in FIG. 11 is the same as that in FIG. 1 with respect to the fact that two horizontal shift registers of a frame transfer CCD are arranged. These horizontal shift registers are designated by reference numerals 300 and 32, respectively. Reference numerals 400 and 42 respectively denote output amplifiers for converting charge data components of the horizontal shift registers 300 and 32 to voltage signals. Each element designated by any other reference numeral is the same element as in FIG. 4. The solid signal processing device of FIG. 11 is substantially the same as that of FIG. 1, except that the number of horizontal cells of the horizontal shift register 300 is about twice that of the horizontal shift register 32. The number of horizontal cells of the horizontal shift register 300 is $\frac{2}{3}$ the number of the horizontal memory cells of the memory 2.

The drive method of the horizontal shift registers 300 and 32 will be described with reference to FIG. 12.

Figure 12:
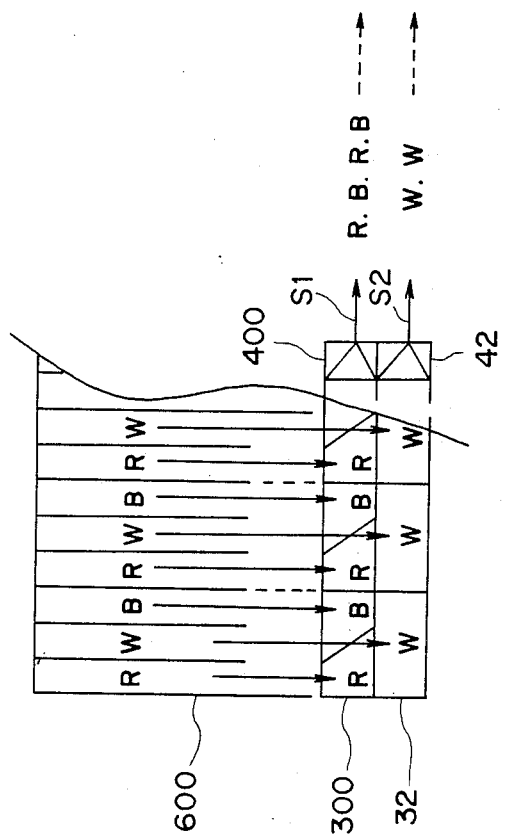
FIG. 12 is a diagram for explaining a signal readout method used in the solid state signal processing device shown in FIG. 11.

Referring to FIG. 12, reference numeral 600 denotes a color separation filter adhered to an image sensing part 1 of the CCD. However, for illustrative convenience, reference numeral 600 indicates a charge component (of a filter element of an individual color) which is transferred from the image sensing part 1 to the memory 2. The color separation filter 600 comprises a stripe color filter having red (R), white (W) and blue (B) transparent filter elements. Another combination of colors may be used. Alternatively, a mosaic color filter may be used in place of a stripe color filter.

The stored charge components in the memory 2 are transferred to the horizontal shift registers 300 and 32 in units of horizontal lines. In this case, the charge component corresponding to the R filter portion is transferred to the horizontal shift register 300. The charge component of the W filter portion is transferred to the horizontal shift register 32 through the register 300. Thereafter, the charge component corresponding to the B filter portion is transferred to the horizontal shift register 300. As a result, the charge components corresponding to the R and B filter portion are stored in the horizontal shift register 300, and the charge component corresponding to the W filter portion is stored in the horizontal shift register 32.

If the spatial frequency of each pel of the image sensing part 1 corresponds to a frequency of 14.3 MHz, the horizontal shift register 300 can be driven by a clock signal having a frequency of about 9.5 MHz, and the horizontal shift register 32 can be driven by a clock signal having a frequency of about 4.8 MHz.

Therefore, the horizontal shift registers 300 and 32 have structures wherein the electrode widths are respectively 3/2 and 3 times ($\frac{2}{3}$ and $\frac{1}{3}$ corresponding to the number of horizontal cells of the image sensing part 1 and the number of horizontal memory cells of the memory 2 with respect to the number of bits) the electrode widths of the conventional horizontal registers.

Figure 13:
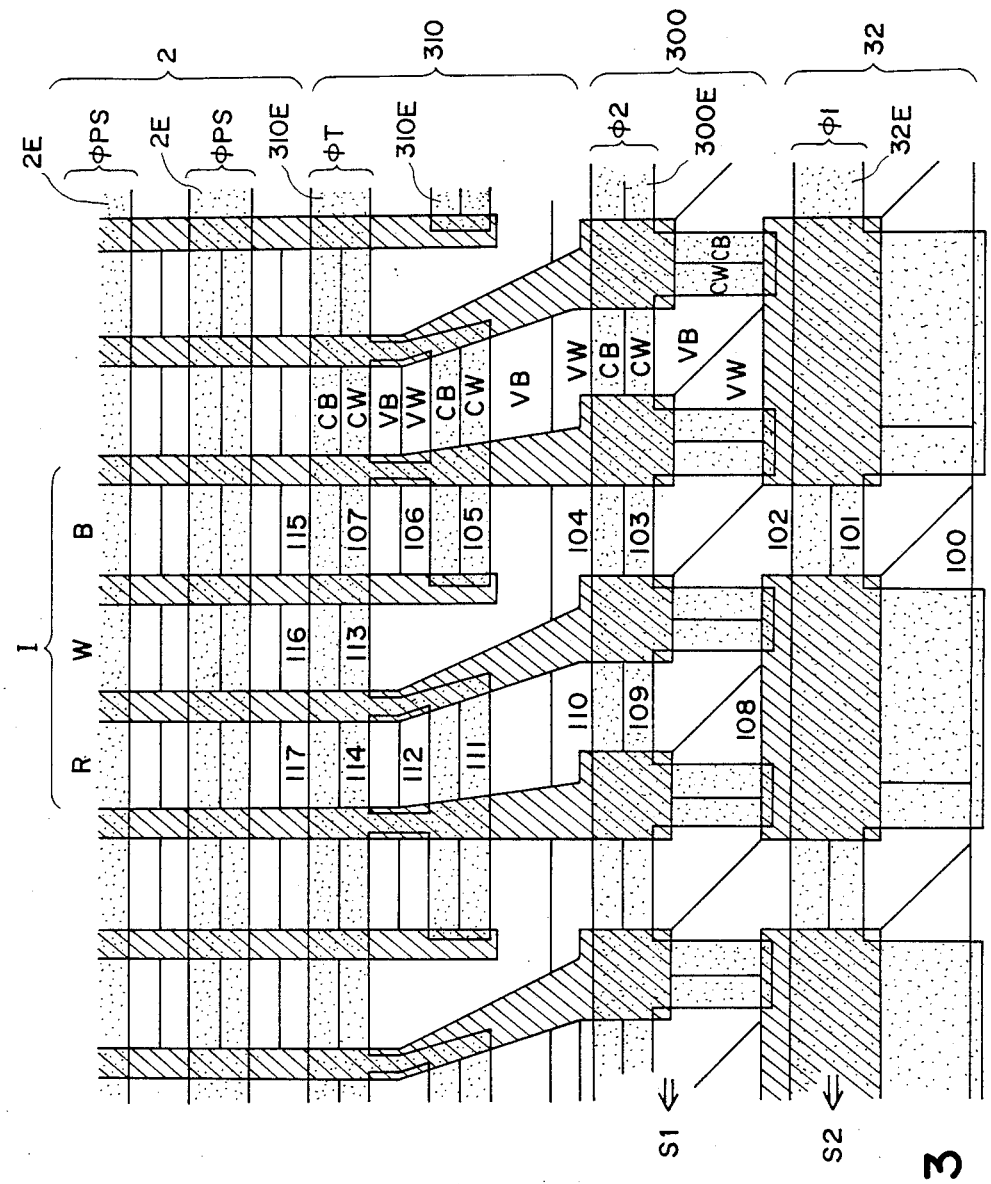
FIG. 13 is a plan view showing the main part of the device shown in FIG. 11.
Figure 14:
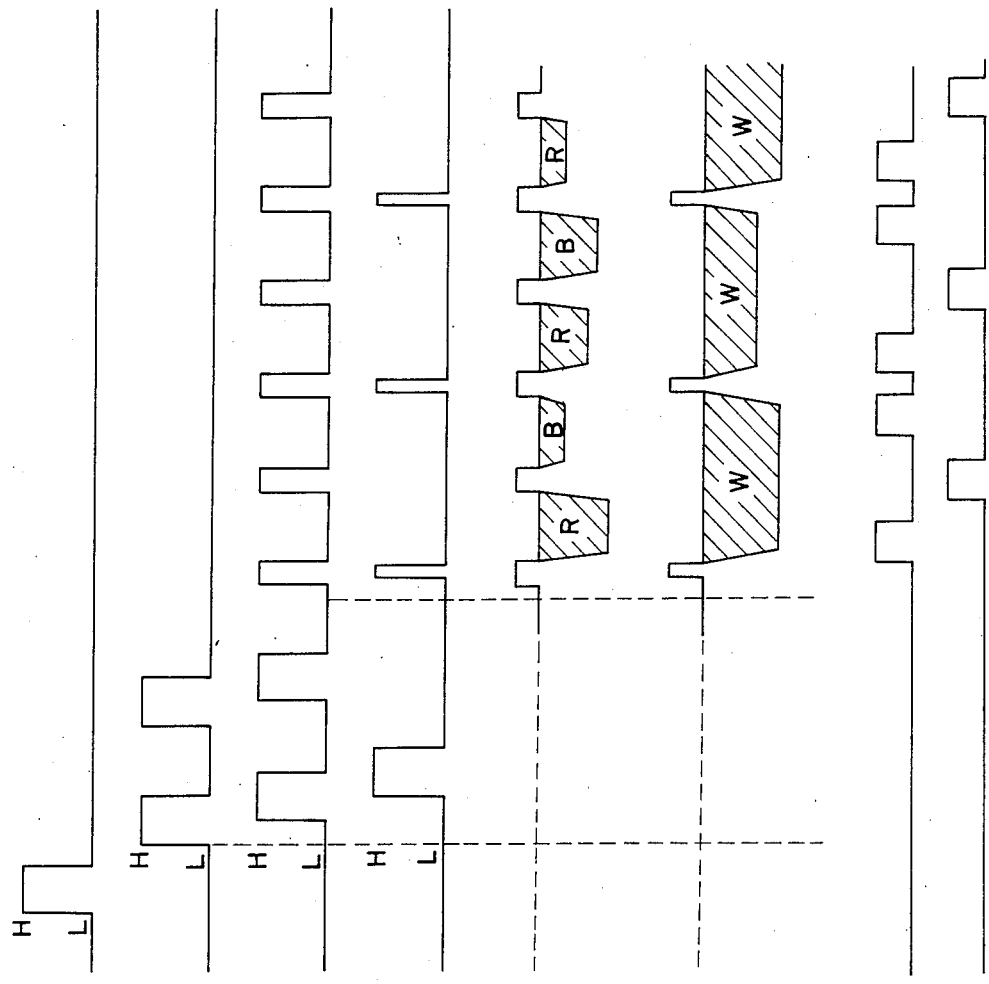
FIG. 14 is a timing chart of drive clocks.

FIG. 13 shows an arrangement of the vicinity of the horizontal shift registers 300 and 32 of the solid state signal processing device shown in FIG. 11. FIG. 14 is a timing chart of the associated drive signals.

Referring to FIG. 13, reference numeral 2E denotes a transfer electrode; 300E and 32E, transfer electrodes of the horizontal shift registers 300 and 32, respectively; and 310, a separation input section for selectively transferring the one-line data of the memory 2 to the horizontal shift registers 300 and 32. The input section 310 serves as the transfer electrode in FIG. 13. However, a control gate electrode may be arranged in units of horizontal bits to control the vertical transfer in units of horizontal bits. Reference numeral 310E denotes a transfer electrode of the separation input section 310. A clock pulse $\phi 2$ is applied to each of the electrodes 300E of the horizontal shift register 300. A clock pulse $\phi 1$ is applied to each of the electrodes 32E of the horizontal shift register 32. A clock pulse $\phi T$ is applied to each of the transfer electrodes 310E of the separation input section 310.

Reference symbols VB and VW denote virtual electrodes, respectively; CB and CW, underlying portions of the transfer electrodes. When potentials of the virtual electrodes VB and VW and the portions CB and CW are given as P(VB), P(VW), P(CB) and P(CW) with respect to the electrons, the condition P(VW) > P(VB) or P(CW) > P(CB) is established. When a voltage of high level is applied to the transfer electrodes, the condition P(CB) > P(VW) is established. However, when a voltage of low level is applied to the transfer electrodes, the condition P(VB) > P(CW) is established. The hatched portions indicate channel stoppers, respectively.

The operation for driving the image sensing device having the construction described above in response to clock pulses will be described with reference to FIGS. 13 and 14.

It should be noted that the vertical charge transfer from the image sensing part 1 to the memory 2 is performed in the same manner as in the conventional frame transfer CCD. Therefore, only the differences will be described wherein the last one-line data of the memory 2 is divided and stored in the horizontal shift registers 300 and 32 through the separation input section 310. By way of simplicity, charge data transfer is described only for the three arrays corresponding to a set I of the memory 2 which represents a set of R, W and B color components. The same operation as in the set I can, of course, be performed in another set of three arrays.

At time t1, when the clock pulse $\phi T$ applied to the electrodes 310E of the separation input section 310 goes high, the charge components stored in portions 115, 116 and 117 of the last one-line data are transferred to portions 107, 113 and 114 of the separation input section 310, respectively. Thereafter, when the clock pulse $\phi T$ goes low, the charge components in the portions 107, 113 and 114 are transferred to portions 106, 104 and 112, respectively. When the clock pulses $\phi 2$ and $\phi 1$ are respectively supplied to the electrodes 300E and 32E of the horizontal shift registers 300 and 32 slightly after the clock pulse $\phi T$ is supplied to the transfer electrodes 310E, the charge component stored in the portion 104 of the separation input section 310 (i.e., the charge component originally stored in the portion 116) is stored in a portion 100 of the horizontal shift register 32 through portions 103 and 102 of the horizontal shift register 300 and a portion 101 of the horizontal shift register 32.

When the clock pulse $\phi T$ is supplied to the separation input section 310, the charge components in the portions 106 and 112 of the separation input section 310 are transferred to the portions 104 and 110 through portions 105 and 111, respectively. When the clock pulse $\phi 2$ is supplied to the horizontal shift register 300 slightly after the clock pulse $\phi T$ is supplied to the transfer electrodes 310E, the charge component (i.e., the charge component originally stored in the portion 115) stored in the portion 104 of the separation input section 310 is transferred to the portion 102 of the horizontal shift register 300 through the portion 103 of the horizontal shift register 300. At the same time, the charge component (i.e., the charge component originally stored in the portion 117) stored in the portion 110 of the separation input section 310 is transferred to a portion 108 of the horizontal shift register 300 through a portion 109 of the horizontal shift register 300, and is stored therein.

In the manner as described above, the charge components stored in the last one-line are divided in a ratio of 2 : 1 (R and B arrays : W array) into units of individual color components through the separation input section 310 during a time interval between time t1 and time t2.

Thereafter (i.e., after time t2), when the clock pulses $\phi 2$ and $\phi 1$ are supplied to the horizontal shift registers 300 and 32, respectively, the input charge components are sequentially read out.

When a one-horizontal line charge component of the memory 2 is completely read out through the horizontal shift registers 300 and 32, a clock pulse $\phi PS$ is supplied to the memory 2 so as to shift the one-horizontal line charge component in the vertical direction, so that the next one-line charge component can be stored in the last line. Thereafter, the operation during the time interval between times t1 and t2 is repeated, so that the new one-line charge component can be divided in a ratio of 2 : 1 and can be stored in the horizontal shift registers 300 and 32.

By repeating the above operation, the stored charge components of all lines are read out from the memory 2 in a ratio of 2 : 1 (color components R and B : color component W). The output S1 supplied from the output amplifier 400 to the horizontal shift register 300 alternately includes the R and B signals. The output S2 supplied from the output amplifier 42 to the horizontal shift register 32 includes only the W signal. The ratio of the frequency of the signal S1 to the frequency of the signal S2 is given to be 2 : 1. Furthermore, the switches SW1 and SW2 shown in FIG. 11 are turned on/off at the timings shown in FIG. 14, so that the signals S1 and S2 can be converted to a dot-sequential signal.

The arrangement shown in FIG. 13 is obtained by using two read shift registers. A simple modification can be made if three read shift registers are used. In other words, in order to obtain the function shown in FIG. 10, the number of cells of the register 300 is set to equal that of the register 32. Furthermore, the vertical transfer paths of the R, W and B components are guided to the three registers, respectively, and the numbers of the R, W and B vertical transfer paths differ from each other at the separation input section, although the vertical transfer paths of the W and B component are led to the registers 300 and 32 in the same arrangement as shown in FIG. 13. Such a device having three registers is described in U.S. application Ser. No. 474,048, now U.S. Pat. No. 4,513,313.

Figure 15:
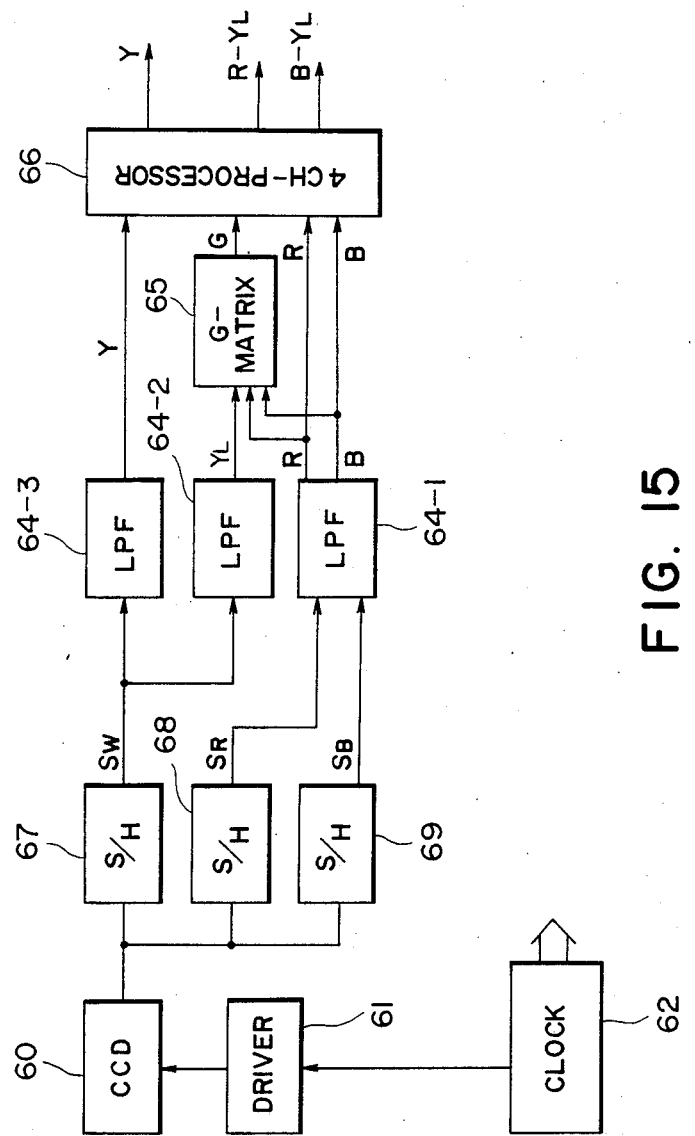
FIG. 15 is a block diagram showing an application example of a signal processor using the solid state signal processing device shown in FIG. 2.

FIG. 15 shows a first embodiment of a signal processor which adopts the R-W-B system of the color separation filter. A CCD 60 is driven by a driver 61 which generates a predetermined voltage signal in response to a clock pulse generated from a clock generator 62 as a controlling means.

The output from the CCD 60 is sampled/held by sample/hold circuits 67 to 69 at given timings. Signals $S_W$, $S_R$ and $S_B$ corresponding to the W, R and B components are obtained. The output $S_W$ from the sample/hold circuit 67 is filtered through a low-pass filter 64-3 having a considerably high frequency bandwidth, so that the clock noise component is removed from the output $S_W$, thereby obtaining a luminance (Y) signal. The signal $S_W$ is also filtered through a low-pass filter 64-2 having an upper filtration bandwidth of about 1 MHz obtaining a low-frequency luminance signal ($Y_L$). The signal filtered through the low-pass filter 64-2 is supplied to G matrix circuit 65 for preparing the G (green) signal. The signals $S_R$ and $S_B$ respectively sampled/held by the sample/hold circuits 68 and 69 are supplied together to a low-pass filter 64-1 having the same filtration range as the filter 64-2. The signals $S_R$ and $S_B$ filtered through the low-pass filter 64-1 are supplied to the G matrix circuit 65 and a 4-channel processor 66, respectively. The G matrix circuit 65 synthesizes the green (G) signal in accordance with the red and blue signals and the low-frequency luminance signal as follows:

$$G = (Y_L - 0.3R - 0.11B)/0.59$$

The G signal and the R and B signals are subjected to gamma processing, white clipping and black clipping in the processor 66, thereby preparing $(R-Y_L)$ and $(B-Y_L)$ color difference signals.

The color difference signals can be derived from the R, G and B signals in the manner as described above, so that color reproducibility can be improved. The arrangement of the sample/hold circuit for separating a color signal from the dot-sequential signal can be simplified.

Figure 16:
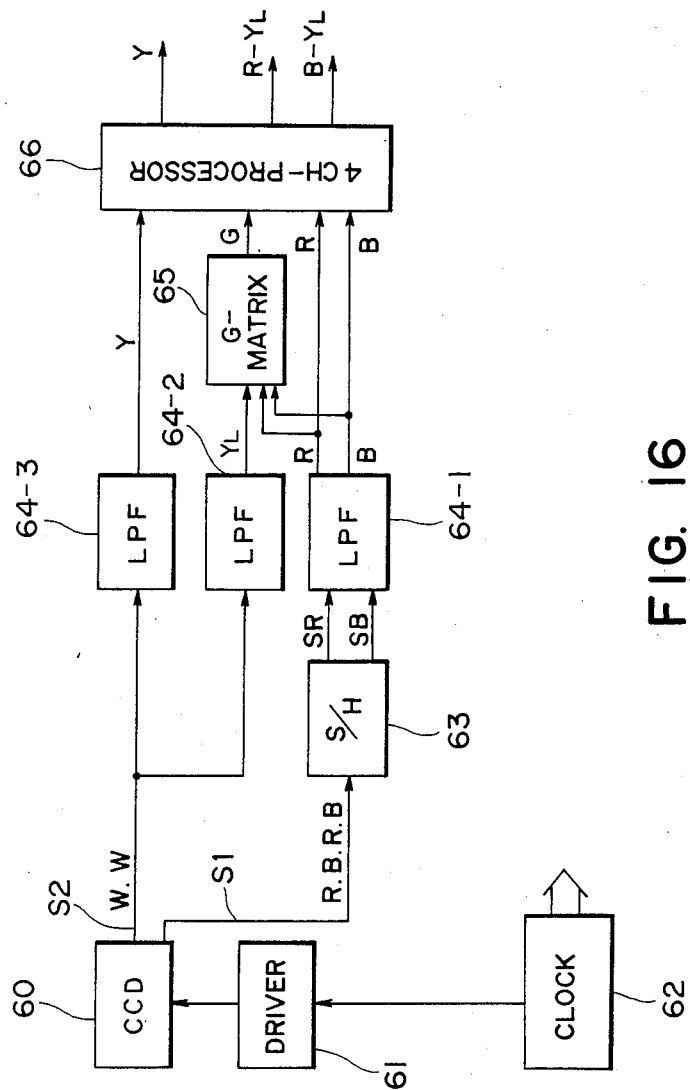
FIG. 16 is a block diagram showing another application example.

FIG. 16 shows still another embodiment of a signal processor using the CCD of FIGS. 11 to 13. In this embodiment, the signals S1 and S2 are processed without being mixed by the switches SW1 and SW2.

The white (W) dot-sequential signal S2 and the alternate red (R) and blue (B) dot-sequential signal S1 are respectively generated from two output amplifiers (not shown) of a CCD 60. The signal S2 is directly supplied to low-pass filters 64-2 and 64-3. The dot-sequential signal S1 is separated into signals $S_R$ and $S_B$, and the divided signals are supplied to a low-pass filter 64-1. Any other element and arrangement of the signal processor shown in FIG. 16 is substantially the same as that of the processor shown in FIG. 15.

In the processor shown in FIG. 16, the dot-sequential signals are not prepared by a switching operation by means of the switches SW1 and SW2, so it is difficult to perform sampling in a sample/hold circuit 63. However, an additional sample/hold circuit for the W component need not be used, so that the circuit construction can be simplified.

In the above embodiment, two shift registers are used for a tricolor filter. However, three or more shift registers may be provided in accordance with the types and number of colors. In the above embodiments, the present invention is applied to the frame transfer CCD. However, the present invention may also be applied to an interline CCD, an X-Y addressing MOS image sensor, a CPD (charge priming device) and the like.

In the above embodiments, the image sensor is used as the solid state signal processing device. A general frame memory or a RAM may be used in place of the image sensor. Furthermore, a CPD (charge priming device) can be used in place of the CCD.

According to the present invention, the one horizontal line data of the memory is divided and stored in a plurality of horizontal shift registers, thereby improving the transfer efficiency and increasing an S/N ratio. Furthermore, the valid signal duration in each horizontal shift register is prolonged, so that a simple sample/hold circuit can be used to supply an output from the shift register thereto.

The output from each register thus obtained is converted from the charge component to the voltage signal. Thereafter, the dot-sequential signal having the same order as the horizontal line of the memory is synthesized, so that the following signal processing circuit can be simplified in accordance with a single system.

The duty of the duration of the valid signal component can be improved as compared with the system wherein only one horizontal shift register is used to read out the data from the memory.

In addition to these advantages, the outputs from the horizontal shift registers can be mixed when the noise components of the output amplifiers are eliminated, thereby readily obtaining an IC circuit.

Furthermore, in order to obtain three or more color signal components by using two read shift registers, three sample/hold circuits are conventionally required for each register to separate the dot-sequential signal. Therefore, a total of six sample/hold circuits are required, so the circuit becomes complex. However, according to the present invention, two shift register outputs are synthesized to be a one-channel signal, thus simplifying the circuit arrangement.

I claim:

1. A signal processing chip comprising:
    (a) a chip;
    (b) a storage unit on said chip for storing a plurality of signals of different colors;
    (c) a plurality of readout units on said chip for dividing the color signals from each line of said storage unit, and for reading out the divided color signals; said plurality of readout units comprising a charge transfer structure;
    (d) switching means on said chip for selectively supplying to a common output terminal the color signals read out by said plurality of readout units as a color sequential signal;
    (e) an output amplifier arranged at an end of each one of said plurality of readout units; and
    (f) a dummy amplifier which has the same electrical characteristics as said output amplifiers and which is arranged so that the color signals read out by said plurality of readout units are not inputted to it.

2. A chip according to claim 1, further including means for subtracting an output of said dummy amplifier from outputs of said output amplifiers.

3. A signal processing system comprising in combination:
    (a) one image pickup means and a plurality of optical filters having different color transmission characteristics associated with said image pickup means, said image pickup means generating a plurality of color signals corresponding to radiation incident thereon through said optical filters;
    (b) storage means for storing the signals;
    (c) a plurality of readout means for dividing the signals from said storage means into said plurality of color signals and for reading out the divided color signals;
    (d) switching means for sequentially supplying to a common output terminal the color signals read out by said plurality of readout means, said switching means being formed on one chip together with said storage means and said plurality of readout means;
    (e) controlling means for controlling said switching means to output a dot-sequential signal; and
    (f) processing means for processing the dot-sequential signal into a luminance signal.

4. A processing system according to claim 3, wherein said plurality of readout means are arranged to read out signals from a plurality of predetermined portions of said storage means.

5. A processing system according to claim 3, wherein said plurality of readout means are arranged to read out signals corresponding to a plurality of portions of a horizontal line of an image from said storage means.

6. A processing system according to claim 3, wherein said plurality of optical filters constitutes a color stripe filter for color-coding light incident on said image pickup means.

7. A processing system according to claim 6, wherein said plurality of optical filters have different primary color transmission characteristics.

8. A processing system according to claim 7, wherein each of said readout means is arranged to read out a color signal corresponding to ones of said optical filters having a respective one of the different primary color transmission characteristics.

9. A processing system according to claim 8, wherein said controlling means controls said switching means such that the color signals read out by said plurality of readout means are selectively supplied to said common output terminal in an order corresponding to the arrangement of said optical color filters.

10. A processing system according to claim 3, wherein said plurality of readout means comprise a charge transfer structure.

11. A processing system according to claim 10, wherein said plurality of readout means comprise one part having a predetermined number of cells and another part having a number of cells which differs from the predetermined number.

12. A signal processing system comprising in combination:
(a) storage means for storing a plurality of signals of different colors;
(b) a plurality of readout means for dividing the color signals from each line of said storage means, and for reading out the divided color signals, said plurality of readout parts comprising a charge transfer structure;
(c) switching means for selectively supplying to a common output terminal the color signals read out by said plurality of readout means as a color sequential signal, said switching means being formed on one chip together with said storage means and said plurality of readout means;
(d) controlling means for controlling said switching means to output a signal;
(e) an output amplifier arranged at an end of each one of said plurality of readout means; and
(f) a dummy amplifier which has the same electrical characteristics as said output amplifiers and which is arranged so that the signals read out by said plurality of readout means are not inputted to it.

13. A processing system according to claim 12, further including means for subtracting an output of said dummy amplifier from outputs of said output amplifiers.

14. An image sensing device including:
(a) an image sensing unit including a plurality of pixels arranged in a matrix having rows and columns;
(b) a storage unit for storing signals formed by said pixels of said image sensing unit;
(c) a plurality of readout units, including at least three readout units, for reading out signals corresponding to one horizontal line of an image from said storage unit in a divided manner, each of said plurality of readout units including a respective predetermined number of cells which have a charge transfer function;
(d) conversion units respectively arranged at output terminals of said plurality of readout units, said conversion units each being arranged to convert a charge signal to a predetermined signal;
(e) switching means for selectively supplying outputs from said conversion units to a common output terminal; and
(f) controlling means for controlling said switching means so as to recombine the signals corresponding to one horizontal line of an image read out from said storage unit in a divided manner by said plurality of readout units.

15. An image sensing device according to claim 14, wherein each said conversion unit is an amplifier which converts said charge signal to a voltage signal.

16. An image sensing device according to claim 14, wherein ratios of the respective predetermined numbers of cells of the plurality of readout units are expressible as ratios of integers.

17. An image sensing device according to claim 14, further including a color filter for color-coding light incident on said image sensing unit.

18. An image sensing device according to claim 17, wherein said color filter comprises a combination of a plurality of filter elements of different colors, and wherein each of said readout units is arranged to read out signals corresponding to ones of said filter elements of a different respective color.

19. A device comprising:
(a) storage means for storing signals;
(b) a plurality of readout units for reading out the signals from said storage means, said plurality of readout units including one part having a predetermined number of cells and a second part having a number of cells which differs from the predetermined number by more than two;
(c) switching means for selectively supplying to a common line the signals read out by said plurality of readout units;
(d) an image sensing unit for supplying image signals to said storage unit; and
(e) a color filter for color-coding light incident on said image sensing unit.

20. A device according to claim 19, wherein said plurality of readout units are arranged to read out signals from a plurality of predetermined portions of said storage means.

21. A device according to claim 19, wherein said plurality of readout units are arranged to read out signals corresponding to a plurality of portions of a horizontal line of an image from said storage means.

22. A device according to claim 19, wherein said color filter comprises a plurality of groups of color filter elements, each of said groups of color filter elements having a different color and corresponding to a different one of said readout units, and wherein each of said readout units comprises a number of cells, and the number of cells of each readout unit is substantially equal to the number of color filter elements in the corresponding group of color filter elements.

23. A device according to claim 19, further comprising:
color separation means for separating the signals supplied to said common line into a plurality of color signals; and
level adjusting means for adjusting the level of at least one of the color signals.

24. A device comprising:
(a) a storage unit for storing a plurality of signals of different colors;
(b) a plurality of readout units for reading out the color signals from said storage unit, all of said readout units storing color signals from a same line of said storage unit;
(c) an output amplifier arranged at an end of each of said plurality of readout units;
(d) a dummy amplifier having the same characteristics as said output amplifiers, said dummy amplifier being arranged so that the color signals read out by said plurality of readout units are not inputted to it;

(e) means for substracting an output of said dummy amplifier from outputs of said output amplifiers; and (f) switching means for selectively supplying to a common line the color signals read out by said plurality of readout units as a color sequential signal.

25. A device according to claim 24, wherein said plurality of readout units are arranged to read out signals from a plurality of predetermined portions of said storage unit.

26. A device according to claim 24, wherein said plurality of readout units are arranged to read out signals corresponding to a plurality of portions of a horizontal line of an image from said storage unit.

27. A device according to claim 24, further including an image sensing unit for supplying image signals to said storage unit.

28. A device according to claim 27, further including a color filter for color-coding light incident on said image sensing unit.

29. A device according to claim 28, wherein said color filter comprises a combination of a plurality of different color filter elements.

30. A device according to claim 29, wherein each of said readout units is arranged to read out signals corresponding to ones of said filter elements of a respective color.

31. A solid-state signal processing device including:
(a) a storage unit for storing data; and
(b) a plurality of readout units having a charge transfer function arranged so as to read out data from said storage unit;
    said plurality of readout units comprising one part having a predetermined number of cells and a second part having a number of cells differing from the predetermined number, wherein the number of cells of said one part is substantially two times the number of cells of said second part.

32. A solid-state signal processing device including:
(a) a storage unit for storing data; and
(b) a plurality of readout units having a charge transfer function arranged so as to read out data from said storage unit, said plurality of readout units comprising two readout units;
    said plurality of readout units comprising one part having a predetermined number of cells and a second part having a number of cells differing from the predetermined number, wherein the number of cells of said one part is substantially two times the number of cells of said second part.

33. A device comprising:
(a) storage means for storing signals;
(b) a plurality of readout units for reading out the signals from said storage means, said plurality of readout units including one part having a predetermined number of cells and a second part having a number of cells which differs from the predetermined number by more than two; and
(c) switching means for selectively supplying to a common line the signals read out by said plurality of readout units;
    wherein the number of cells of said one part is substantially two times the number of cells of said second part.

34. A device comprising:
(a) storage means for storing signals;
(b) a plurality of readout units for reading out the signals from said storage means, said plurality of readout units including one part having a predetermined number of cells and a second part having a number of cells which differs from the predetermined number by more than two; and
(c) switching means for selectively supplying to a common line the signals read out by said plurality of readout units;
    wherein said readout units are arranged to read out signals from a plurality of predetermined portions of said storage means; and
        wherein the number of cells of said one part is substantially two times the number of cells of said second part.

35. An image sensing apparatus comprising:
(a) a storage unit for storing data;
(b) three readout units having a charge transfer function for reading out the data from said storage unit, each of said three readout units comprising a respective predetermined number of cells;
(c) an image sensing unit for supplying image data to said storage unit; and
(d) switching means for selectively switching in a predetermined order three signals respectively output from said three readout units.

36. An apparatus according to claim 35, wherein the respective predetermined number of cells of said three readout units are all the same.

37. An apparatus according to claim 35 wherein said switching means selectively supplies the output signals from said three readout units to a common output terminal.

38. An apparatus according to claim 35, wherein said three readout units are respectively arranged such that said three readout units read out data from said storage unit in a divided manner.

39. An apparatus according to claim 38, wherein said three readout units are respectively arranged such that said three readout units read out data corresponding to a horizontal line of an image from said storage unit in a divided manner.

40. An apparatus according to claim 35, further comprising a color filter for color-coding light incident on said image sensing unit.

41. An apparatus according to claim 40, wherein said color filter comprises a combination of a plurality of different color filter elements.

42. An apparatus according to claim 41, wherein each of said three readout units is arranged to read out data corresponding to ones of said filter elements of a respective color.

43. An image sensing apparatus comprising:
(a) an image sensing unit for converting incident radiation into image data;
(b) three readout units having a charge transfer function for reading out the image data from said image sensing unit; and
(c) switching means for selectively switching in a predetermined order signals output from said three readout units;
    wherein each of said three readout units comprises a respective number of cells, the respective numbers of cells of said three readout units being all the same.

44. An apparatus according to claim 43, wherein said switching means selectively supplies the output signals from said three readout units to a common output terminal.

45. An apparatus according to claim 43, wherein said three readout units are respectively arranged such that said three readout units read out data from said image sensing unit in a divided manner.

46. An apparatus according to claim 45, wherein said three readout units are respectively arranged such that said three readout units read out data corresponding to a horizontal line of an image from said image sensing unit in a divided manner.

47. An apparatus according to claim 43, further comprising a color filter for color-coding light incident on said image sensing unit.

48. An image sensing apparatus comprising:
(a) an image sensing unit for converting incident radiation into image data;
(b) three readout units having a charge transfer function for reading out the image data from said image sensing unit;
(c) switching means for selectively switching in a predetermined order signals output from said three readout units; and
(d) a color filter for color-coding light incident on said image sensing unit;
wherein said color filter comprises a combination of a plurality of filter elements of different colors.

49. An image sensing device including:
(a) an image sensing unit including a plurality of pixels arranged in a matrix having rows and columns, said pixels forming data representing a sensed image;
(b) a plurality of readout units, including at least three readout units, for reading out data corresponding to one horizontal line of said sensed image from said image sensing unit in a divided manner, said units having a charge transfer function, each of said plurality of readout units including a respective predetermined number of cells which have a charge transfer function;
(c) switching means for selectively supplying outputs from said plurality of readout units to a common output terminal; and
(d) controlling means for controlling said switching means to recombine the data corresponding to one horizontal line of an image read out from said image sensing unit in a divided manner by said plurality of readout units.

50. An image sensing device according to claim 49, wherein ratios of said respective predetermined numbers of cells of said plurality of readout units are expressible as ratios of integers.

51. An image sensing device according to claim 49, further including a color filter for color-coding light incident on said image sensing unit.

52. An image sensing device according to claim 51, wherein said color filter comprises a combination of a plurality of color filter elements of different colors, and wherein each of said readout units is arranged to read out data corresponding to ones of said filter elements of a different respective color.

53. An image sensing device according to claim 49, further comprising a storage unit for storing said data formed by said pixels of said image sensing unit.

54. An image sensing device according to claim 53, wherein said storage unit has a charge transfer function.

55. An image sensing device according to claim 49, further comprising conversion units respectively arranged at output terminals of said plurality of readout units, said conversion units each being arranged to convert a charge signal to a predetermined signal.

56. An image sensing device according to claim 55, wherein said switching means selectively supplies the signals converted by said conversion units to said common output terminal.

* * * * *

UNITED STATES PATENT AND TRADEMARK OFFICE
CERTIFICATE OF CORRECTION

PATENT NO. : 4,985,758
DATED : January 15, 1991
INVENTOR(S) : Seiji Hashimoto It is certified that error appears in the above-identified patent and that said Letters Patent is hereby corrected as shown below:

<u>COLUMN 10</u>,
    Line 56, "$MH_z$" should read --$MH_z$, thereby--.

<u>COLUMN 16</u>,

Line 29, "number" should read --numbers--; and
    Line 31, "claim 35" should read --claim 35,--.

Signed and Sealed this

Eleventh Day of August, 1992

*Attest:*

DOUGLAS B. COMER

*Attesting Officer*     *Acting Commissioner of Patents and Trademarks*